United States Patent
Kim et al.

(10) Patent No.: US 7,493,547 B2
(45) Date of Patent: Feb. 17, 2009

(54) APPARATUS FOR CODING LOW DENSITY PARITY CHECK CODE AND METHOD THEREOF

(75) Inventors: Nam-Il Kim, Daejeon (KR); In-Hwa Jung, Daejeon (KR); Kyoung-Joon Lee, Daejeon (KR); Young-Hoon Kim, Daejeon (KR); Sang-Woo Nam, Daejeon (KR); Seung-Chan Bang, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 581 days.

(21) Appl. No.: 11/154,394

(22) Filed: Jun. 15, 2005

(65) Prior Publication Data
US 2006/0123314 A1    Jun. 8, 2006

(30) Foreign Application Priority Data
Nov. 25, 2004    (KR)    ................ 10-2004-0097480

(51) Int. Cl.
*H03M 13/00*    (2006.01)
(52) U.S. Cl. .................. 714/758; 714/784; 714/786
(58) Field of Classification Search ............. 714/758, 714/784, 794
See application file for complete search history.

(56) References Cited

U.S. PATENT DOCUMENTS

| | | | |
|---|---|---|---|
| 3,896,416 A * | 7/1975 | Barrett et al. | 714/774 |
| 6,895,547 B2 * | 5/2005 | Eleftheriou et al. | 714/801 |
| 7,120,856 B2 * | 10/2006 | Zhang et al. | 714/801 |
| 7,178,082 B2 * | 2/2007 | Yu et al. | 714/752 |
| 2003/0037298 A1 * | 2/2003 | Eleftheriou et al. | 714/752 |
| 2004/0221223 A1 * | 11/2004 | Yu et al. | 714/800 |
| 2006/0123314 A1 * | 6/2006 | Kim et al. | 714/758 |

FOREIGN PATENT DOCUMENTS

KR    10-2004-0044590    5/2004

OTHER PUBLICATIONS

Thomas J. Richardson, et al; 'Efficient Encoding of Low-Density Parity-Check Codes'; IEEE Transations on Information Theory, vol. 47, No. 2, pp. 638-656, Feb. 2001.
John L. Fan, 'Array Codes as Low-Density Parity—Check Codes', 2nd International Symposium on Turbo Codes & Related Topics, vol. 1, pp. 543-546 Sep. 4-7, 2000.

* cited by examiner

*Primary Examiner*—Joseph D Torres
(74) *Attorney, Agent, or Firm*—Blakely, Sokoloff, Taylor & Zafman

(57) ABSTRACT

The present invention provides a coding device of a low-density parity-check (LDPC) code for simply coding information data without generating a code generator matrix. The coding device forms a parity-check matrix having two sub-matrixes. At this time, the first sub-matrix is a random matrix or a structural matrix. The second sub-matrix is a structural matrix having two 1s in each column. Parity data is calculated by using the structural second matrix without calculating an inverse matrix of the second matrix when temporary data is generated by using the first sub-matrix with reference to the information data. Code data is generated from the parity data and the information data and is transmitted.

6 Claims, 5 Drawing Sheets

FIG.2A

$$H_A = \begin{bmatrix} I & I & I & \text{------} & I \\ I & a & a^2 & \text{------} & a^{(k-1)} \\ I & a^2 & a^4 & \text{------} & a^{2(k-1)} \\ | & | & | & \diagdown & | \\ I & a^{j-1} & a^{2(j-1)} & & a^{(j-1)(k-1)} \end{bmatrix}$$

FIG.2B

$$H = \begin{bmatrix} I & I & I & \text{---} & I & I & \text{---} & I \\ O & I & a & \text{---} & a^{j-2} & a^{j-1} & \text{---} & a^{k-2} \\ O & O & I & \text{---} & a^{2(j-3)} & a^{2(j-2)} & \text{---} & a^{2(k-3)} \\ | & | & | & \diagdown & | & | & & \\ O & O & O & \text{---} & I & a^{j-1} & \text{---} & a^{(j-1)(k-1)} \end{bmatrix}$$

FIG.3A
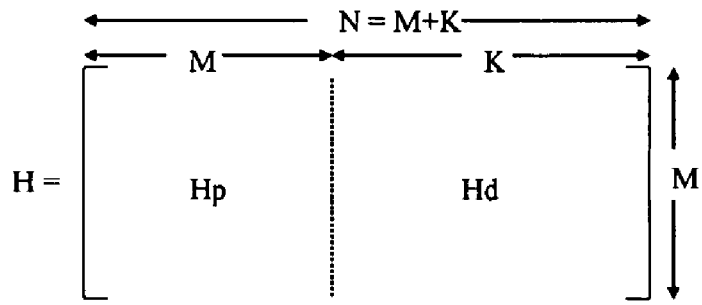
FIG.3B
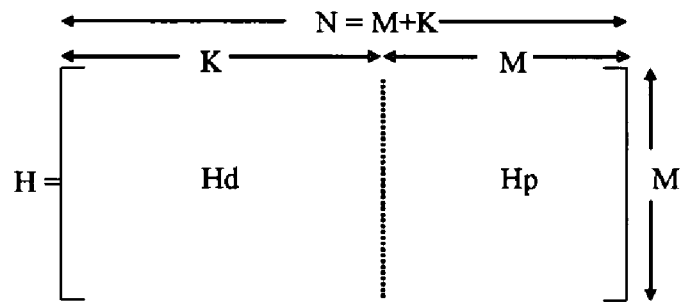
FIG.4
$$H_p = \begin{bmatrix} 1 & 0 & 0 & 0 & \cdots & 0 & 0 & 0 \\ 0 & 1 & 0 & 0 & \cdots & 0 & 0 & 0 \\ 1 & 0 & 1 & 0 & \cdots & 0 & 0 & 0 \\ 0 & 1 & 0 & & \cdots & 0 & 0 & 0 \\ 0 & 0 & 1 & & & 0 & 0 & 0 \\ 0 & 0 & 0 & & & 1 & 0 & 0 \\ \vdots & \vdots & \vdots & & & 0 & 1 & 0 \\ 0 & 0 & 0 & & & 1 & 0 & 1 \end{bmatrix}$$

APPARATUS FOR CODING LOW DENSITY PARITY CHECK CODE AND METHOD THEREOF

CROSS REFERENCE TO RELATED APPLICATION

This application claims priority to and the benefit of Korea Patent Application No. 10-2004-0097480 filed on Nov. 25, 2004 in the Korean Intellectual Property Office, the entire content of which is incorporated herein by reference.

BACKGROUND OF THE INVENTION (a) Field of the Invention

The present invention relates to a coding method in a communication system. More specifically, the present invention relates to a method for generating a parity-check matrix of low-density parity-check (LDPC) codes and coding the low-density parity-check LDPC codes.

(b) Description of the Related Art

Much research and development has been carried out on high speed and high data rate transmission methods as requirements of a broadband multimedia wireless service in a wireless communication system have significantly increased. An LDPC coding method is a method for increasing data rates by efficiently correcting data transmission errors caused by distortion of signals, and the method has been researched and developed in relation to a 4$^{th}$ generation mobile communication system, a satellite communication system, and a high-speed wireless local area network (LAN).

The LDPC coding method is one of block coding methods using matrixes before transmitting information bits. A block coding operation is performed by using a coding matrix having few non-zero elements in the LDPC coding method. A parity-check matrix H is used as the coding matrix, and the parity-check matrix H is a large size sparse matrix having few non-zero elements.

The parity-check matrix H has a relation with code data C as shown in Equation 1.

$$H*C^T=0 \quad \text{[Equation 1]}$$

where code data C includes information data S and parity data P, that is, C=[S P].

Various LDPC coding methods have been suggested to calculate the parity data P.

The parity-check matrix H is divided into sub-matrixes [A B] (that is, H=[A B]), and the parity data P is calculated by using Equation 1 as shown in Equation 2 without calculating a code generator matrix in a conventional coding method.

$$H*C^T=[A\ B]*[S\ P]^T=0$$

$$AS^T = BP^T$$

$$P^T = B^{-1}AS^T \quad \text{[Equation 2]}$$

At this time, an inverse matrix operation of the sub-matrix B of the parity-check matrix H is required. Therefore, the LDPC coding operation becomes complicated and coding speed is reduced.

In another conventional LDPC coding method, the parity-check matrix H is formed as shown in FIG. 1 in order to efficiently perform the LDPC coding operation, and a sub-matrix operation of the parity-check matrix H is simplified to calculate the parity data.

$$H^{en} = \begin{bmatrix} A & B & T \\ C & D & E \end{bmatrix} \quad \text{[Equation 3]}$$

$$H = \begin{bmatrix} I & 0 \\ -ET^{-1} & I \end{bmatrix} * H^{en} =$$

$$\begin{bmatrix} A & B & T \\ -ET^{-1}A+C & -ET^{-1}B+D & 0 \end{bmatrix}$$

where a sub-matrix T is a lower triangular matrix.

When the code data C is [S P1 P2], the parity data is calculated by using Equations 1 and 3 as shown in Equation 4.

$$H*C^T = \quad \text{[Equation 4]}$$

$$\begin{bmatrix} A & B & T \\ -ET^{-1}A+C & -ET^{-1}B+D & 0 \end{bmatrix} * [S\ P_1\ P_2]^T = 0$$

$$AS^T + BP_1^T + TP_2^T = 0$$

$$(-ET^{-1}A+C)ST + (-ET^{-1}B+D)P_1^T = 0$$

$$\text{where, } \phi = -ET^{-1}B+D$$

$$P_1^T = -\phi^{-1}(-ET^{-1}A+C)ST$$

$$P_2^T = -T^{-1}(AS^T + BP_1^T)$$

$$C = [S\ P_1\ P_2]$$

In this LDPC coding method, an inverse matrix $\Phi^{-1}$ of a matrix $\Phi$ calculated by the sub-matrix operation of the parity-check matrix H is required to be calculated. The inverse matrix $\Phi^{-1}$ is not calculated when a determinant of the matrix $\Phi$ is 0. Accordingly, a problem exists in that the parity-check matrix H is required to be regenerated.

Parity-check matrixes shown in FIG. 2A and FIG. 2B may be used in another conventional method for performing the parity LDPC coding operation without calculating the inverse matrix of the sub-matrix of the parity-check matrix H.

As shown in FIG. 2A and FIG. 2B, the parity-check matrix H includes a [p×p] commutative matrix a. I is a [p×p] unit matrix, O is a [p×p] zero matrix, and a is a matrix moved by k from the [p×p] unit matrix. For example, when p is 5, a is given as below.

$$a = \begin{bmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 0 & 0 & 0 \end{bmatrix}$$

At this time, the parity-check matrix H is divided into the sub-matrixes [A B] (that is, H=[A B]), and the sub-matrix A is a triangular matrix. Accordingly, a generator matrix is not required to be generated, and no inverse matrix calculation is required. In this case, the parity data is calculated by an operation according to Equation 5.

$$H*C^T=[A\ B]*[P\ S]^T=0$$

$$AP^T = BS^T = X \quad \text{[Equation 5]}$$

The parity data P is calculated by a back substitution by using the triangular matrix A. However, a problem exists in that a memory is required to store the sub-matrix A, and an additional operation for the parity calculation by the back substitution is also required.

SUMMARY OF THE INVENTION

The present invention provides a coding device of a low-density parity-check (LDPC) code for storing part of a parity-check matrix in a storage unit in order to increase a coding speed without calculating an inverse matrix of the parity-check matrix (or a sub-matrix of the parity-check matrix).

Accordingly, the present invention provides a coding device of the LDPC code for coding information data by using the parity-check matrix.

The present invention discloses a coding device of an LDPC code for coding information data by using a parity-check matrix. The coding device includes a sub-matrix generator, a matrix calculator, a parity data generator, and a code data generator. The sub-matrix generator generates a plurality of sub-matrixes including first and second sub-matrixes for configuring the parity-check matrix. The matrix calculator generates temporary data by an operation of the first sub-matrix and the information data. The parity data generator generates the parity data of a predetermined operation on the generated temporary data and the second sub-matrix. The code data generator generates code data with reference to the generated parity data and the information data. At this time, the second sub-matrix is a square matrix having two 1s in each column, and the first sub-matrix is a random matrix which is not a 4-cycle matrix or a structural matrix.

The present invention also discloses a method for coding information data by using a parity-check matrix. In the method, a) first and second matrixes are generated and form the parity-check matrix; b) temporary data is generated with reference to the first sub-matrix and the information data; c) parity data is generated by using the second sub-matrix with reference to the generated temporary data; and d) code data is generated with reference to the generated parity data and the information data. The first and second sub-matrixes may each be a random matrix or a structural matrix. One-bit or two-bit parity data may be generated by using the second sub-matrix in c).

BRIEF DESCRIPTION OF THE DRAWINGS

FIG. 2A and FIG. 2B respectively show diagrams for representing another conventional parity-check matrix of a low-density parity-check (LDPC) matrix.

FIG. 3A and FIG. 3B respectively show configurations of a parity-check matrix of an LDPC code according to an exemplary embodiment of the present invention.

FIG. 4 shows a configuration of a sub-matrix of the parity-check matrix of the LDPC code according to the exemplary embodiment of the present invention.

DETAILED DESCRIPTION OF THE PREFERRED EMBODIMENTS

Figure 1:
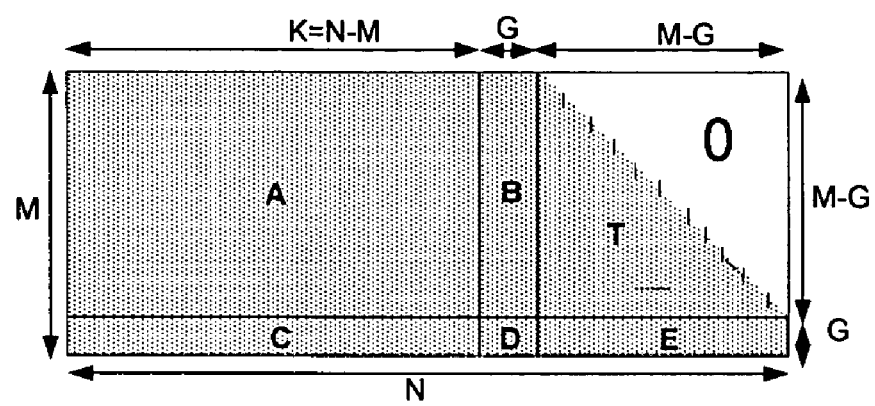
FIG. 1 shows a diagram for representing a conventional parity-check matrix of a low-density parity-check (LDPC) matrix.

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive. To clarify the present invention, parts which are not described in the specification are omitted, and parts for which similar descriptions are provided have the same reference numerals.

A coding device of a low-density parity-check (LDPC) code according to an exemplary embodiment of the present invention and a method thereof will now be described with reference to figures.

The coding device of the LDPC code generates parity data P from information data S, and connects the information data S and the parity data P to generate code data C. At this time, the code data C is [1×N], and is satisfied with a relation of C=[P S]. The information data S is [1×K], and the parity data P is [1×M]. At this time, a relation of N=M+K is satisfied.

A configuration of the parity-check matrix according to the exemplary embodiment of the present invention will be described with reference to FIG. 3A to FIG. 4.

FIGS. 3a and 3b respectively show the configurations of the parity-check matrix of the LDPC code according to the exemplary embodiment of the present invention.

As shown in FIG. 3A, a parity-check matrix H is an [M×N] matrix, and the parity-check matrix H may include sub-matrixes of [Hp Hd] where the sub-matrix Hp is an [M×M] matrix, and the sub-matrix Hd is an [M×K] matrix.

As shown in FIG. 3B, the parity-check matrix H may include sub-matrixes of [Hd Hp] where the sub-matrix Hd is an [M×K] matrix, and the sub-matrix Hp is an [M×M] matrix.

FIG. 4 shows a sub-matrix configuration of the parity-check matrix of the LDPC code according to the exemplary embodiment of the present invention.

As shown in FIG. 4, elements which have the same row and column numbers have values of 1, elements in which a difference obtained by subtracting a row number from a column number is 2 also have values of 1, and the remaining elements have values of 0 in the sub-matrix Hp of the parity-check matrix H. At this time, the sub-matrix Hp is a sparse matrix, and is used as an operation for generating the parity data and is generated by a first program as below.

```
Hp = eye(M,M);
    for (i = 2 : M – 1)
        for (j = 0 : M – 3)
            if (j == i – 2)
                Hp(i, j) = 1;
            end
        end
    end
``` where eye(M,M) denotes an [M×M] unit matrix.

In a different way from FIG. 4, the elements which have the same row and column numbers have values of 1, elements in which a difference obtained by subtracting the column number from the row number is 2 also have values of 1, and the remaining elements have values of 0 in the sub-matrix Hp of the parity-check matrix H. At this time, the sub-matrix Hp is the sparse matrix, and is generated by a second program as below.

```
Hp = eye(M,M);
for (i = 0 : M − 3)
    for (j = 2 : M − 1)
        if (j − 2 == i)
            Hp(i, j) = 1;
        end
    end
end
``` where eye(M,M) denotes the [M×M] unit matrix.

In addition, elements in which a sum of the column and row numbers is a matrix size M have values of 1, elements in which the sum of the column and row numbers is M+1 also have values of 1, and the remaining elements have values of 0. At this time, the sub-matrix Hp is the sparse matrix, and is generated by a third program as below.

```
Hp = fliplr(eye(M,M));
for (i = 2 : M − 1)
    for (j = 2 : M − 1)
        if (j − 2 == M − 1 − i)
            Hp(i, j) = 1;
        end
    end
end
``` where eye(M,M) denotes the [M×M] unit matrix, and fliplr (H) is a function for horizontally exchanging respective column elements of the matrix H.

The elements in which the sum of the column and row numbers is the matrix size M have values of 1, elements in which the sum of the column and row numbers is M−3 also have values of 1, and the remaining elements have values of 0. At this time, the sub-matrix Hp is the sparse matrix, and is generated by a fourth program as below.

```
Hp = fliplr(eye(M,M));
for (i = 0 : M − 3)
    for (j = 0 : M − 3)
        if (j + 2 == M − i − 1)
            Hp(i, j) = 1;
        end
    end
end
``` where eye(M,M) denotes the [M×M] unit matrix, and fliplr (H) is the function for horizontally exchanging respective column elements of the matrix H.

Figure 5:
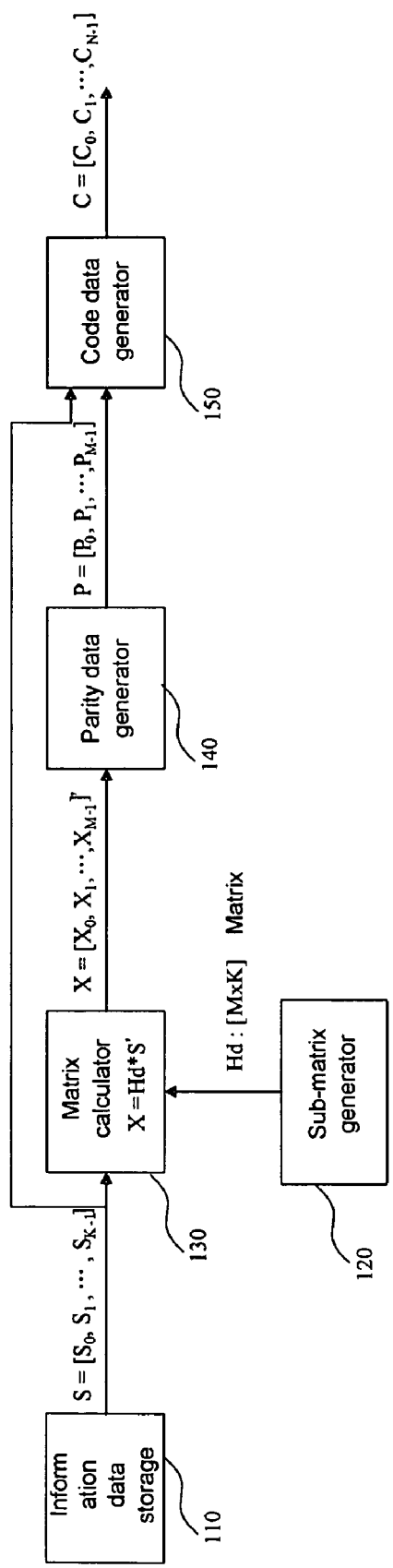
FIG. 5 shows a configuration of a coding device of the LDPC code according to the exemplary embodiment of the present invention.

FIG. 5 shows a configuration of the coding device of the LDPC code according to the exemplary embodiment of the present invention.

As shown in FIG. 5, the coding device of the LDPC code includes an information data storage unit 110, a sub-matrix generator 120, a matrix calculator 130, a parity data generator 140, and a code data generator 150.

The information data storage unit 110 stores the information data S.

The sub-matrix generator 120 generates the sub-matrixes Hp and Hd of the parity-check matrix and stores them. The sub-matrix Hd is an [M×K] sparse parity-check matrix H, and is formed in a random matrix which is not a 4-cycle matrix or a structural matrix. The sub-matrix Hp is generated by the first to fourth programs as described above.

The matrix calculator 130 generates temporary data X by using values of the information data S and the sub-matrix Hd in an operation shown in Equation 6, and inputs the temporary data X to the parity data generator 140.

$$X = Hd * S^T \quad \text{[Equation 6]}$$

where $S=[S_0, S_1, \ldots, S_{k-1}]$, and $X=[X_0, X_1, \ldots, X_{M-1}]$

The parity data generator 140 generates the parity data P by using the calculated temporary data in a predetermined operation. Accordingly, the inverse matrix calculation and the additional memory for generating the parity data are not required in the exemplary embodiment of the present invention.

The parity data generator 140 generates the parity data P by the predetermined operation of the temporary data and the sub-matrix Hp generated by the first to fourth programs.

At this time, the parity data P is generated by a fifth or a sixth program when the sub-matrix Hp generated by the first program is used.

The fifth program is as below.

```
p₀ = x₀;
p₁ = x₁;
for (i = 2 : i < M : i + +)
    pᵢ = xᵢ + pᵢ₋₂;
    pᵢ = mod(pᵢ,2);
end
```

The sixth program is as below.

```
p₀ = x₀;
p₁ = x₁;
for (i = 1 : i < floor(M/2) : i + +)
    p_{2i} = x_{2i} + p_{2i−2};
    p_{2i+1} = x_{2i+1} + p_{2i−1};
    p_{2i} = mod(p_{2i},2);
    p_{2i+1} = mod(p_{2i+1},2);
end
p_{M−1} = mod( x_{M−1} + p_{M−3} ,2);
``` where mod(a, b) denotes a remainder obtained by dividing a by b, and floor(a) is an integer which is not greater than a.

In addition, the parity data P is generated by a seventh or an eighth program when the sub-matrix Hp generated by the second program is used.

The seventh program is as below.

```
p_{M−1} = x_{M−1};
p_{M−2} = x_{M−2};
for (i = M − 3 : i >= 0 : i − −)
    pᵢ = xᵢ + p_{i+2};
    pᵢ = mod(pᵢ,2);
end
```

The eighth program is as below.

```
p_{M−1} = x_{M−1};
p_{M−2} = x_{M−2};
for (i = floor(M/2)−1 : i > 0 : i − −)
```

-continued $$p_{2i+mod(M,2)-1} = x_{2i+mod(M,2)-1} + p_{2i+mod(M,2)+1};$$
$$p_{2i+mod(M,2)-2} = x_{2i+mod(M,2)-2} + p_{2i+mod(M,2)};$$
$$p_{2i+mod(M,2)-1} = mod(p_{2i+mod(M,2)-1}, 2);$$
$$p_{2i+mod(M,2)-2} = mod(p_{2i+mod(M,2)-2}, 2);$$
end
$$p_0 = mod(x_0 + p_2, 2);$$

The parity data P is also generated by a ninth or a tenth program when the sub-matrix Hp generated by the third program is used.

The ninth program is as below.

$$p_{M-1} = x_0;$$
$$p_{M-2} = x_1;$$
for (i = M − 3 : i >= 0 : i − −)
$$p_i = x_{M-i-1} + p_{i+2};$$
$$p_i = mod(p_i, 2);$$
end The tenth program is as below.

$$p_{M-1} = x_0;$$
$$p_{M-2} = x_1;$$
for (i = floor(M/2)−1 : i > 0 : i − −)
$$p_{2i+mod(M,2)-1} = x_{M-2i-mod(M,2)} + p_{2i+mod(M,2)+1};$$
$$p_{2i+mod(M,2)-2} = x_{M-2i-mod(M,2)+1} + p_{2i+mod(M,2)};$$
$$p_{2i+mod(M,2)-1} = mod(p_{2i+mod(M,2)-1}, 2);$$
$$p_{2i+mod(M,2)-2} = mod(p_{2i+mod(M,2)-2}, 2);$$
end
$$p_0 = mod(x_{M-1} + p_2, 2);$$

The parity data P is also generated by an eleventh or twelfth program when the sub-matrix Hp generated by the fourth program is used.

The eleventh program is as below.

$$p_0 = x_{M-1};$$
$$p_1 = x_{M-2};$$
for (i = 2 : i > M : i + +)
$$p_i = x_{M-i-1} + p_{i-2};$$
$$p_i = mod(p_i, 2);$$
end The twelfth program is as below.

$$p_0 = x_{M-1};$$
$$p_1 = x_{M-2};$$
for (i = floor(M/2)−1 : i > 0 : i − −)
$$p_{2i+mod(M,2)-1} = x_{M-2i-mod(M,2)} + p_{2i+mod(M,2)+1};$$
$$p_{2i+mod(M,2)-2} = x_{M-2i-mod(M,2)+1} + p_{2i+mod(M,2)};$$
$$p_{2i+mod(M,2)-1} = mod(p_{2i+mod(M,2)-1}, 2);$$
$$p_{2i+mod(M,2)-2} = mod(p_{2i+mod(M,2)-2}, 2);$$
end
$$p_0 = mod(x_0 + p_2, 2);$$

The one-bit parity data is generated when the fifth, seventh, ninth, and eleventh programs are used to generate the parity data by the parity data generator 140, and the two-bit data parity data are generated when the sixth, eighth, tenth, and twelfth programs are used to generate the parity data. Accordingly, a high-speed coding function of the LDPC code may be performed.

The code data generator 150 generates the code data C from the parity data P generated by the parity data generator 140 and the information data S stored in the information data storage unit 110 by one of the fifth to twelfth programs.

Therefore, a part or the entire parity-check matrix is suggested as the structural matrix, and therefore input data is simply coded without generating a code generating matrix.

An LDPC coding method according to the exemplary embodiment of the present invention will be described with reference to FIG. 6.

Figure 6:
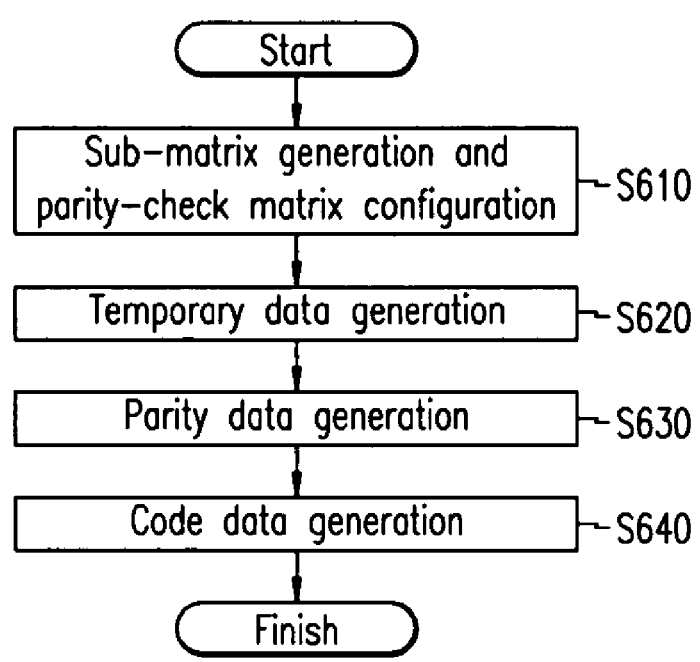
FIG. 6 shows an operation of the coding device of the LDPC code according to the exemplary embodiment of the present invention.

FIG. 6 shows a flow chart of an operation of the coding device of the LDPC code according to the exemplary embodiment of the present invention.

As shown in FIG. 6, the coding device forms the parity-check matrix having two sub-matrixes in order to perform a simple and fast coding operation of the LDPC code according to the exemplary embodiment of the present invention. That is, H=[Hp Hd], or H=[Hd Hp]. The sub-matrix Hp is an [M×M] structural matrix having two 1s in each column. The other sub-matrix Hd is an [M×K] matrix having random values or an [M×K] structural matrix in step S610.

The coding device of the LDPC code having a k length of the information data S and an N length of the code data C generates an M length of parity data P. At this time, a relation of M=N−K is satisfied, and the code data C has a relation with the parity check matrix H and the information data S as shown in Equation 1.

$$H*C^T = 0 \quad \text{[Equation 7]}$$

where the parity-check matrix H is an [M×N] matrix, and the code data C is [1×N]. The code data C includes the information data S and the parity data P, and generally a relation of C=[S P] is satisfied.

Equation 8 is given when the parity-check matrix H is substituted with the sub-matrixes [Hp Hd] in Equation 7.

$$H*C^T = [Hp\ Hd]*[P\ S]^T = 0 \quad \text{[Equation 8]}$$

where $Hp*P^T = Hd*S^T$, and Hp is the structural matrix.

Accordingly, the coding device of the LDPC code generates the parity data P without calculating the inverse matrix of the sub-matrix Hp in step S630 when the temporary data is generated by an operation of the sub-matrix Hd and information data S in step S620.

The coding device of the LDPC code generates the code data from the parity data P and the information data S in step S640. As described, the coding device of the LDPC code according to the exemplary embodiment of the present invention simply performs the LDPC coding operation by using an intermediate matrix value without using an inverse matrix operation and the additional memory.

According to the exemplary embodiment of the present invention, an LDPC coding message is generated from received data by using the parity matrix of the LDPC code instead of using the LDPC code generator matrix, and therefore the configuration of the LDPC coding device may be simplified. Complexity of hardware is reduced because the parity-check matrix is suggested as the structural matrix, and the parity data is generated by a simplified operation without using the additional memory in the LDPC coding device.

In addition, the parity data is generated at high speed by generating the one-bit or two-bit parity data when the parity-check data is generated to generate the code data in the LDPC coding device.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A method for coding information data by using a parity-check matrix including sparse matrixes having few non-zero elements, the method comprising:
   a) generating a first sub-matrix of size (M×K) and a second sub-matrix of size (M×M), by which the parity-check matrix of size M×(M+K) is formed, K being the size of the information data, wherein the second sub-matrix has two 1s in each column and no more than two 1s is in each row;
   b) generating temporary data by using the first sub-matrix with reference to the information data;
   c) generating parity data by using the second sub-matrix with reference to the generated temporary data; and
   d) generating code data that includes the generated parity data and the information data.

2. The method of claim 1, wherein the first sub-matrix is a random matrix.

3. The method of claim 2, wherein the second sub-matrix is a square matrix or a column permutation of the square matrix, the square matrix formed by all 1s along the diagonal and along one sub-diagonal of the square matrix, and all 0s along remaining sub-diagonals.

4. The method of claim 3, wherein, in c), the parity data is calculated by the equation $$H*C^T = [Hp\ Hd]*[P\ S]^T = 0$$

$$Hp*P^T = Hd*S^T,$$

without calculating an inverse matrix of the second sub-matrix, in which $Hd*S^T$ denotes the temporary data, Hp denotes the second sub-matrix, and P denotes the parity data.

5. The method of claim 4, wherein one-bit parity data or two-bit parity data is generated by using the second sub-matrix in c).

6. The method of claim 5, further comprising: in c), calculating a value of predetermined elements of the parity data with reference to the temporary data; adding the temporary data to the calculated value of the parity data; and performing a modular operation on the added value to calculate values of elements of the parity data except the predetermined elements.

* * * * *